United States Patent
Reznicek et al.

(10) Patent No.: US 11,270,910 B2
(45) Date of Patent: Mar. 8, 2022

(54) INTERCONNECT STRUCTURE WITH PARTIAL SIDEWALL LINER

(71) Applicant: International Business Machines Corporation, Armonk, NY (US)

(72) Inventors: Alexander Reznicek, Troy, NY (US); Oscar van der Straten, Guilderland Center, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/890,370

(22) Filed: Jun. 2, 2020

(65) Prior Publication Data

US 2021/0375671 A1 Dec. 2, 2021

(51) Int. Cl.
*H01L 21/768* (2006.01)
*H01L 23/532* (2006.01)
*H01L 23/522* (2006.01)

(52) U.S. Cl.
CPC .. *H01L 21/76849* (2013.01); *H01L 21/76871* (2013.01); *H01L 23/5226* (2013.01); *H01L 23/53238* (2013.01)

(58) Field of Classification Search
CPC ........... H01L 23/53238; H01L 23/5226; H01L 21/76871
See application file for complete search history.

(56) References Cited

U.S. PATENT DOCUMENTS

| | | | |
|---|---|---|---|
| 6,706,625 B1 | 3/2004 | Sudijono et al. | |
| 6,734,097 B2 | 5/2004 | Iggulden et al. | |
| 7,655,564 B2 | 2/2010 | Shinriki et al. | |
| 8,586,473 B1 | 11/2013 | Tanwar et al. | |
| 9,613,861 B2 | 4/2017 | Anderson et al. | |
| 9,859,215 B1 | 1/2018 | Edelstein et al. | |
| 10,879,114 B1* | 12/2020 | Wu | H01L 21/76873 |
| 2003/0003711 A1 | 1/2003 | Modak | |
| 2016/0049330 A1* | 2/2016 | Peng | H01L 21/76804 257/774 |
| 2016/0163645 A1 | 6/2016 | Kamineni et al. | |
| 2018/0005939 A1 | 1/2018 | Hu et al. | |

OTHER PUBLICATIONS

Y.L. Hsu et al., "Failure Mechanism of Electromigration in Via Sidewall for Copper Dual Damascene Interconnection," Journal of the Electrochemical Society, 153 (8) G782-G786 (Jun. 2006).
Liang Gong Wen, et al. "Atomic layer deposition of ruthenium with TiN interface for sub-10 nm advanced interconnects beyond copper," ACS Applied Materials & Interfaces, vol. 8, No. 39, Sep. 2016, pp. 26119-26125.

* cited by examiner

*Primary Examiner* — Karen Kusumakar
(74) *Attorney, Agent, or Firm* — Jeffrey S. Labaw; Michael J. Chang, LLC

(57) ABSTRACT

An interconnect structure and techniques for fabrication thereof having a partial sidewall liner are provided. In one aspect, the interconnect structure includes: a substrate; a dielectric disposed on the substrate having at least one feature present therein; a barrier layer lining the at least one feature; a seed enhancement liner disposed over the barrier layer along sidewalls of the at least one feature, wherein the seed enhancement liner is present along only a middle portion of the sidewalls of the at least one feature; and at least one interconnect disposed within the at least one feature over the barrier layer and the seed enhancement liner.

19 Claims, 8 Drawing Sheets

US 11,270,910 B2

INTERCONNECT STRUCTURE WITH PARTIAL SIDEWALL LINER

FIELD OF THE INVENTION

The present invention relates to interconnect structures, and more particularly, to a copper (Cu) interconnect structure and techniques for fabrication thereof having a partial sidewall seed enhancement liner for void-free Cu fill without Cu loss at a top of the interconnect structure during polishing.

BACKGROUND OF THE INVENTION

Interconnect structures in semiconductor device designs are typically formed using a damascene or dual damascene process that involves first patterning a feature(s) such as a trench (for metal lines) and/or a via (for conductive vias) in a dielectric, lining the features with a diffusion barrier, and then filling the features with a metal(s) such as copper (Cu). As the size of the interconnect features shrinks, the barrier thickness needs to be scaled down in order to maximize the copper Cu volume. Doing so enables low line and via resistance. Scaling the sidewall barrier thickness and coverage allows for the maximization of Cu volume in the interconnects, and scaling barrier thickness at the via bottom allows for the reduction of via resistance.

For void-free Cu fill at less than or equal to about 24 nanometer (nm) critical dimensions, an additional liner or seed enhancement layer (such as ruthenium (Ru)) is deposited to prevent barrier exposure during Cu plating, especially on the feature sidewalls. Without a seed enhancement layer, sidewall voids will form which lead to poor device performance.

However, the use of a Ru liner provides some notable fabrication challenges. For instance, chemical-mechanical polishing (CMP) of Cu interconnects containing a Ru liner is difficult. Specifically, the galvanic corrosion of Cu during Ru CMP can result in Cu loss at a top interface of the interconnect. Unfortunately, this Cu loss is a key contributor to high line resistance which is undesirable.

Thus, techniques for forming void-free Cu interconnects with a high Cu volume using a Ru liner but eliminating Cu volume loss during CMP would be desirable.

SUMMARY OF THE INVENTION

The present invention provides a copper (Cu) interconnect structure and techniques for fabrication thereof having a partial sidewall seed enhancement liner. In one aspect of the invention, an interconnect structure is provided. The interconnect structure includes: a substrate; a dielectric disposed on the substrate having at least one feature present therein; a barrier layer lining the at least one feature; a seed enhancement liner disposed over the barrier layer along sidewalls of the at least one feature, wherein the seed enhancement liner is present along only a middle portion of the sidewalls of the at least one feature; and at least one interconnect disposed within the at least one feature over the barrier layer and the seed enhancement liner.

In another aspect of the invention, a method of forming an interconnect structure is provided. The method includes: depositing a dielectric onto a substrate; patterning at least one feature in the dielectric; depositing a barrier layer into and lining the at least one feature; forming a seed enhancement liner over the barrier layer along only a middle portion of sidewalls of the at least one feature; and forming at least one interconnect within the at least one feature over the barrier layer and the seed enhancement liner.

A more complete understanding of the present invention, as well as further features and advantages of the present invention, will be obtained by reference to the following detailed description and drawings.

DETAILED DESCRIPTION OF PREFERRED EMBODIMENTS

Provided herein are void-free copper (Cu) interconnect structures with a high Cu volume and techniques for fabrication thereof that leverage the benefits of a seed enhancement liner where needed (in terms of void-free Cu fill), while maintaining a high Cu volume ratio in the trench and eliminating Cu volume loss during chemical-mechanical polishing (CMP) to enable reliable, low line resistance Cu interconnects. Advantageously, the present techniques provide lower overall line resistance (due to relative higher Cu volume), as well as a lower via resistance (due to the absence of a bottom liner, and use of the largest contact area available).

Figure 1:
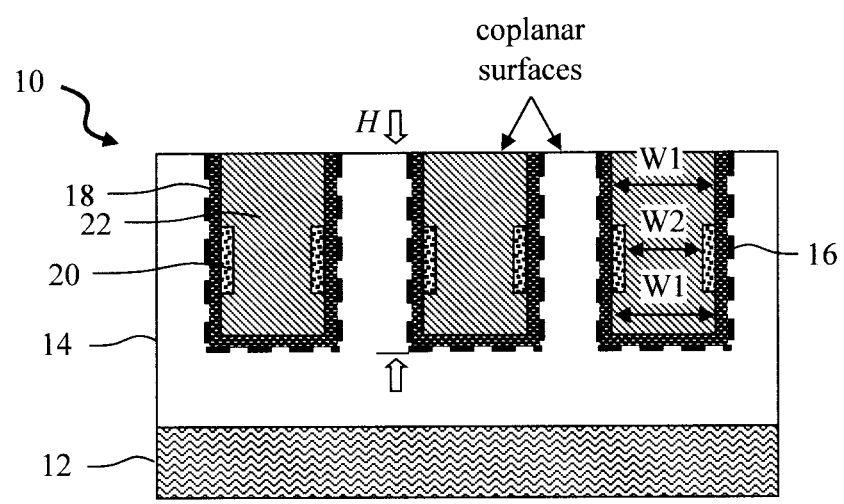
FIG. 1 is a cross-sectional diagram illustrating the present interconnect structure according to an embodiment of the present invention.

FIG. 1 is a diagram illustrating the unique design of the present interconnect structure. Namely, as shown in FIG. 1, an interconnect structure 10 includes a dielectric 14, disposed on a substrate 12, having features 16 present therein. In FIG. 1, dotted lines are used to illustrate the outlines of features 16. By way of example only, features 16 can include trenches and/or vias. It is notable that the present techniques are applicable to interconnect structure designs including any number of features 16, including those having a single feature 16.

According to an exemplary embodiment, substrate 12 is a bulk semiconductor wafer, such as a bulk silicon (Si), bulk germanium (Ge), bulk silicon germanium (SiGe) and/or bulk III-V semiconductor wafer. Alternatively, substrate 12 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 12 may already have pre-built structures (not shown) such as transistors, diodes, capacitors, resistors, isolation regions (e.g., shallow trench isolation (STI) regions), interconnects, wiring, etc.

Suitable materials for dielectric layer 14 include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as chemical vapor deposition (CVD), atomic layer deposition (ALD) or physical vapor deposition (PVD) can be employed to deposit the dielectric layer 14 onto the substrate 12. According to an exemplary embodiment, the dielectric layer 14 has a thickness of from about 10 nanometers (nm) to about 400 nm and ranges therebetween.

A barrier layer 18 is present lining the features 16. Use of such a barrier layer 18 helps to prevent diffusion of the interconnect Cu (see below) into the surrounding dielectric 14. Suitable materials for barrier layer 18 include, but are not limited to, tantalum (Ta), tantalum nitride (TaN), titanium (Ti), titanium nitride (TiN) and/or tungsten nitride (WN). According to an exemplary embodiment, barrier layer 18 has a thickness of from about 1 nm to about 5 nm and ranges therebetween.

A seed enhancement liner 20 is disposed over the barrier layer along opposite sidewalls of the features 16. Suitable materials for the seed enhancement liner 20 include, but are not limited to, ruthenium (Ru), rhodium (Rh) and/or palladium (Pd). According to an exemplary embodiment, the seed enhancement liner 20 has a thickness of from about 2 nm to about 5 nm and ranges therebetween.

As shown in FIG. 1, the seed enhancement liner 20 is present along only a middle portion of those sidewalls of the features 16. Specifically, the seed enhancement liner 20 does not touch the top or the bottom of features 16, i.e., the seed enhancement liner 20 is absent from the sidewalls of the features 16 at the top and bottom of features 16.

More specifically, according to an exemplary embodiment, the middle portion of the sidewalls of the features 16 along which the seed enhancement liner 20 is present is less than or equal to about 60% of a total sidewall height H of features 16, for example, the middle portion of the sidewalls of the features 16 along which the seed enhancement liner 20 is present is from about 50% to about 60% and ranges therebetween of the total sidewall height H of features 16 (see FIG. 1).

As will be described in detail below, the absence of the seed enhancement liner 20 at the top of the features 16 advantageously avoids galvanic corrosion of the Cu at the top of the interconnects during chemical-mechanical polishing (CMP). Galvanic corrosion can lead to Cu loss at the top of the interconnect which is a key contributor to high line resistance.

Interconnects 22 are disposed within the features 16 over the barrier layer 18 and seed enhancement liner 20. See FIG. 1. According to an exemplary embodiment, the interconnects are formed from Cu. As will be described in detail below, according to an exemplary embodiment, a series of seed layers and electroplated Cu collectively form the interconnects 22. However, for clarity, the interfaces between these various layers are not shown in the depiction presented in FIG. 1.

As shown in FIG. 1, the present interconnects 22 have a unique configuration. Notably, due to the absence of the seed enhancement liner 20 at the top of the features 16, Cu loss during CMP after the final plated Cu (see below) is avoided, resulting in a top surface of the interconnects 22 being coplanar with a top surface of the dielectric 14. See FIG. 1.

Further, since the seed enhancement liner 20 is present along only a middle portion of those sidewalls of the features 16, the interconnects 22 have a unique flanged top and bottom. For instance, as shown in FIG. 1, the top and the bottom of interconnects 22 have a width W1, while a middle of the interconnects 22 has a width W2, wherein W1>W2.

Figure 2:
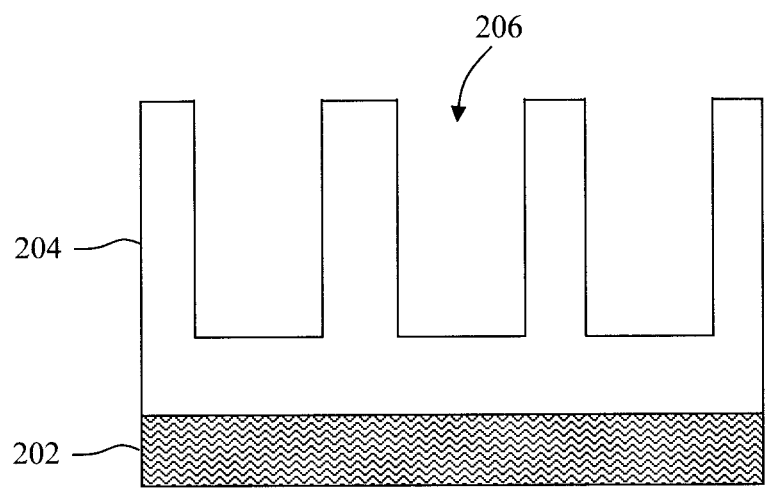
FIG. 2 is a cross-sectional diagram illustrating a dielectric layer having been deposited on a substrate, and at least one feature having been patterned in the dielectric layer according to an embodiment of the present invention.
Figure 3:
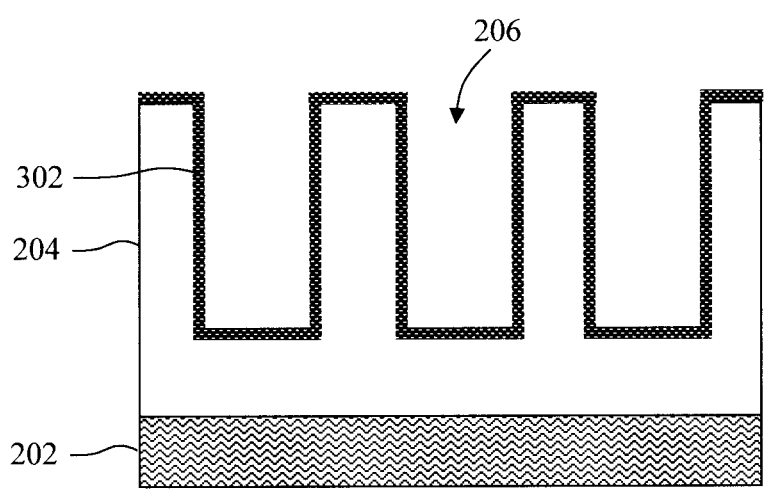
FIG. 3 is a cross-sectional diagram illustrating a conformal barrier layer having been deposited onto the dielectric layer and lining the features according to an embodiment of the present invention.

An exemplary methodology for forming an interconnect structure in accordance with the present techniques is now described by way of reference to FIGS. 2-14. As shown in FIG. 2, the process begins with the deposition of a dielectric layer 204 on a substrate 202, and the patterning of at least one feature 206 in the dielectric layer 204.

As above, substrate 202 can be a bulk semiconductor wafer, such as a bulk Si, bulk Ge, bulk SiGe and/or bulk III-V semiconductor wafer. Alternatively, substrate 202 is a SOI wafer, where the SOI layer includes a semiconductor, such as Si, Ge, SiGe, and/or a III-V semiconductor. Substrate 202 may already have pre-built structures (not shown) such as transistors, diodes, capacitors, resistors, isolation regions (e.g., shallow trench isolation (STI) regions), interconnects, wiring, etc.

As provided above, suitable materials for dielectric layer 204 include, but are not limited to, oxide low-κ materials such as SiOx and/or oxide ULK-ILD materials, e.g., having a dielectric constant κ of less than 2.7, such as pSiCOH. A process such as chemical vapor deposition (CVD), atomic layer deposition (ALD) or physical vapor deposition (PVD) can be employed to deposit the dielectric layer 204 onto the substrate 202. According to an exemplary embodiment, the dielectric layer 204 has a thickness of from about 10 nm to about 400 nm and ranges therebetween.

By way of example only, features 206 include trenches and/or vias. Lithography and etching processes can be employed to pattern the features 206 in dielectric layer 204. With standard lithography and etching processes, a lithographic stack (not shown), e.g., photoresist/organic planarizing layer (OPL)/anti-reflective coating (ARC), is used to pattern a hardmask (not shown). The pattern from the hardmask is then transferred to the underlying layer(s), i.e., in this case dielectric layer 204. The hardmask is then removed. According to an exemplary embodiment, a directional (anisotropic) etching process such as reactive ion etching (RIE) is employed for the feature etch. Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP).

In the present example, the features 206 as patterned extend only partway through the dielectric layer 204. Namely, a portion of the dielectric layer 204 remains at the bottoms of features 206. This remaining portion of the dielectric layer 204 at the bottom of the features 206 will serve to insulate the interconnect structures that will be formed in features 206 from the underlying substrate 202 (see below). As will be apparent from the description that follows, metallization of the features 206 will be used to form metal lines and/or conductive vias when the features 206 are trenches and/or vias, respectively.

A conformal barrier layer 302 is then deposited onto dielectric layer 204 and lining features 206. See FIG. 3. Use of such a barrier layer 302 helps to prevent diffusion of the interconnect Cu (see below) into the surrounding dielectric layer 204. As provided above, suitable materials for barrier layer 302 include, but are not limited to, Ta, TaN, Ti, TiN and/or WN. A process such as CVD, ALD or PVD can be employed to deposit the barrier layer 302. According to an exemplary embodiment, barrier layer 302 has a thickness of from about 1 nm to about 5 nm and ranges therebetween. Additionally, a seed layer (not shown) can be deposited into and lining the features 206 over the barrier layer 302 prior to Cu deposition. A seed layer facilitates plating of the Cu into the features 206. The use of a seed layer is described in detail below.

A Cu fill 402 is then deposited into, and filling, the features 206 over barrier layer 302. See FIG. 4. A process such as sputtering, evaporation or electrochemical plating can be employed to deposit the Cu fill 402 into the features 206. Following deposition, the Cu overburden is removed using a process such as chemical mechanical polishing (CMP). According to an exemplary embodiment, as deposited, Cu fill 402 has a thickness T1 of from about 30 nm to about 50 nm and ranges therebetween.

Figure 4:
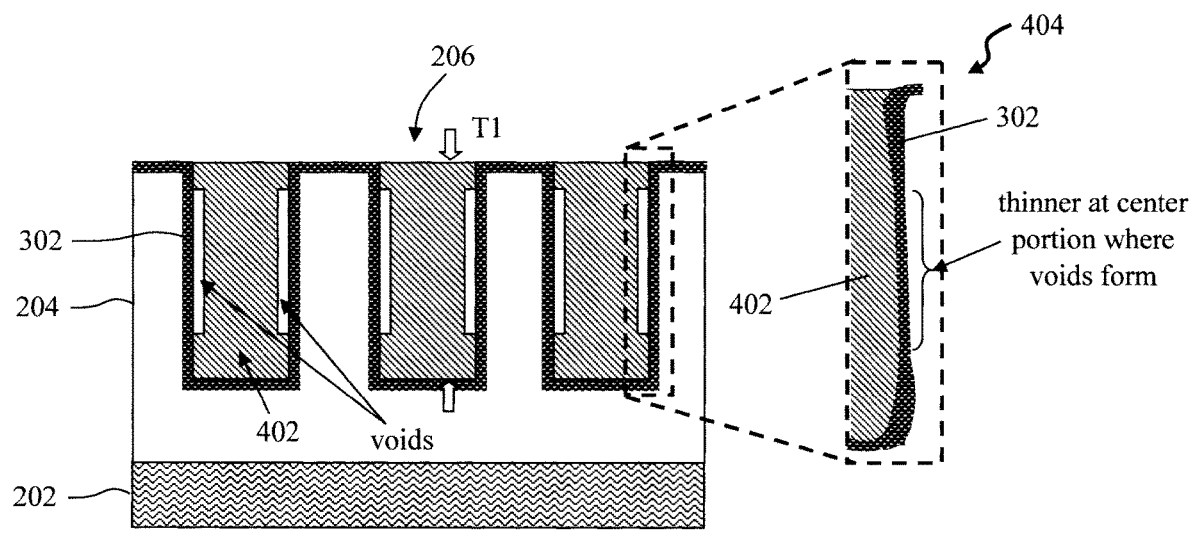
FIG. 4 is a cross-sectional diagram illustrating a first fill having been deposited into, and filling, the features over the barrier layer according to an embodiment of the present invention.
Figure 5:
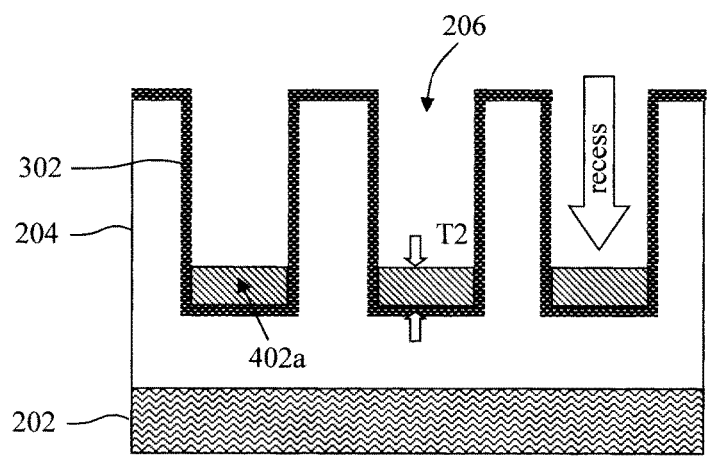
FIG. 5 is a cross-sectional diagram illustrating the first fill having been recessed according to an embodiment of the present invention.
Figure 6:
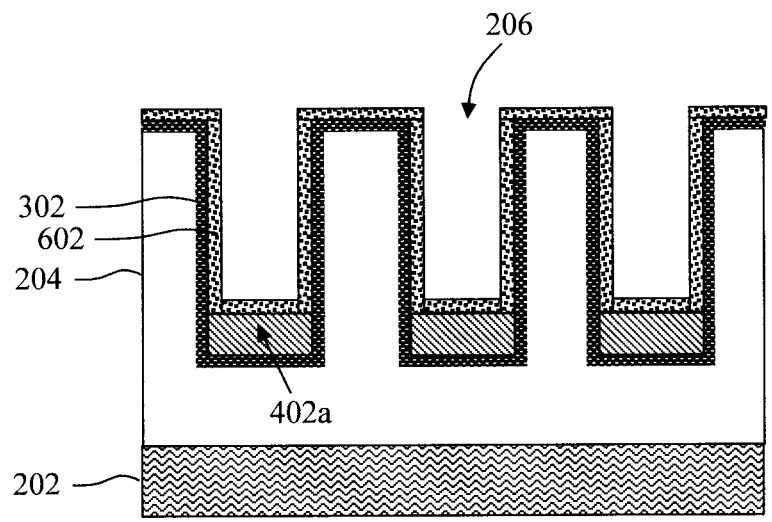
FIG. 6 is a cross-sectional diagram illustrating a conformal seed enhancement liner having been deposited onto the dielectric layer and into the features over the barrier layer and the recessed first Cu fill according to an embodiment of the present invention.

As shown in FIG. 4, during the Cu fill, voids can form in Cu layer 402 such as is shown along the sidewalls of the features 206. These voids can form where the barrier layer 302 is thinnest, such as along the sidewalls of features 206. For instance, due to poor step coverage, in practice the barrier layer 302 deposited along the middle portion of the sidewalls of features 206 can in fact be slightly thinner than the barrier layer 302 at the bottom and top of features 206. See magnified view 404. It is at these thinner regions of barrier layer 302 that voids can form. See, for example, Y. L. Hsu et al., "Failure Mechanism of Electromigration in Via Sidewall for Copper Dual Damascene Interconnection," Journal of the Electrochemical Society, 153 (8) G782-G786 (June 2006), the contents of which are incorporated by reference as if fully set forth herein. This problem is especially prevalent in small features where the overall barrier thickness is scaled down in order to maximize the copper Cu volume to enable low line and via resistance.

The Cu fill 402 is then recessed. See FIG. 5. By way of example only, Cu fill 402 can be recessed at this stage using a wet chemical etching process such as $NH_4OH/H_2O_2$. The recessed Cu is now given reference numeral 402a. According to an exemplary embodiment, this recess etch step leaves Cu fill 402a having only a thickness T2 of from about 5 nm to about 20 nm and ranges therebetween. Doing so ensures that the voids along the sidewalls of features 206 (see FIG. 4) are removed. To look at it another way, Cu fill 402a is recessed below the voids such that, following the recess etch, no voids remain along the sidewalls of features 206.

A conformal seed enhancement liner 602 is next deposited onto dielectric layer 204 and into the features 206 over the barrier layer 302 and recessed Cu fill 402a. See FIG. 6. As provided above, suitable materials for the seed enhancement liner 602 include, but are not limited to, Ru, Rh and/or Pd. A process such as CVD, ALD or PVD can be employed to deposit the seed enhancement liner 602. According to an exemplary embodiment, the seed enhancement liner 602 has a thickness of from about 2 nm to about 5 nm and ranges therebetween. As deposited, the seed enhancement liner 602 is present at the top and bottom, as well as along the sidewalls of features 206. However, the goal will be to ultimately remove all but the portion of the seed enhancement liner 602 along the middle portion of the sidewalls of features 206, i.e., what will remain of the seed enhancement liner 602 will touch neither the top nor the bottom of features 206.

Figure 7:
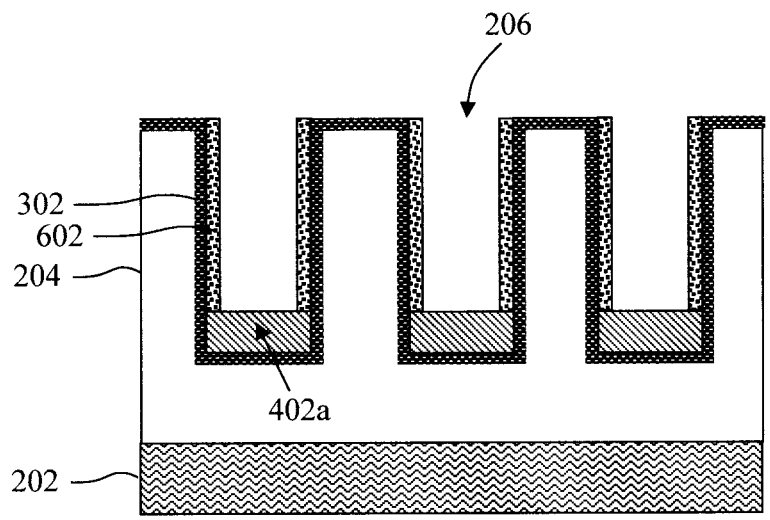
FIG. 7 is a cross-sectional diagram illustrating a recess etch having been used to remove the seed enhancement liner from horizontal surfaces, including along the top surface of the dielectric layer/barrier layer and from the first Cu fill at the bottom of the features according to an embodiment of the present invention.
Figure 8:
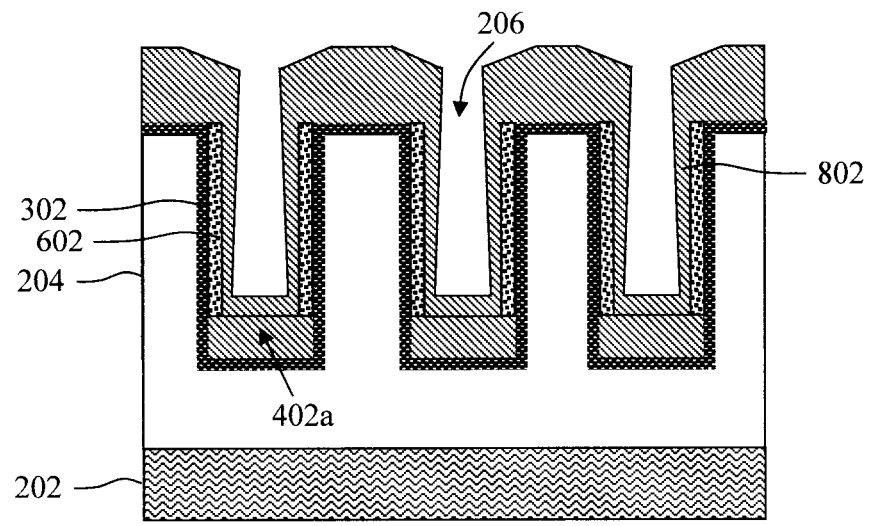
FIG. 8 is a cross-sectional diagram illustrating a first Cu-containing seed layer having been deposited onto the dielectric layer and into the features over the barrier layer and seed enhancement liner, lining the features over the first Cu fill according to an embodiment of the present invention.

A recess etch is then used to remove the seed enhancement liner 602 from horizontal surfaces, including along the top surface of dielectric layer 204/barrier layer 302 and from Cu fill 402a at the bottom of features 206. See FIG. 7. As shown in FIG. 7, seed enhancement liner 602 is now present along only the sidewalls of features 206. According to an exemplary embodiment, the recess etch is performed using a directional (anisotropic) etching process such as RIE.

A Cu-containing seed layer 802 is then deposited onto dielectric layer 204 and into the features 206 over barrier layer 302 and seed enhancement liner 602, lining the features 206 over Cu fill 402a. See FIG. 8. The use of seed layer 802 will facilitate plating of Cu fill 902 (see below) into the features 206. Seed layer 802 can be formed from Cu alone or in combination with one or more other elements such as aluminum (Al) and/or manganese (Mn), i.e., a CuAl or CuMn alloy. A process such as CVD, ALD or PVD can be employed to deposit the seed layer 802. Advantageously, seed enhancement liner 602 enhances adherence of the seed layer 802 along the sidewalls of features 206, thereby ensuring that the seed layer 802 fully lines the features 206 without having any voids.

Figure 9:
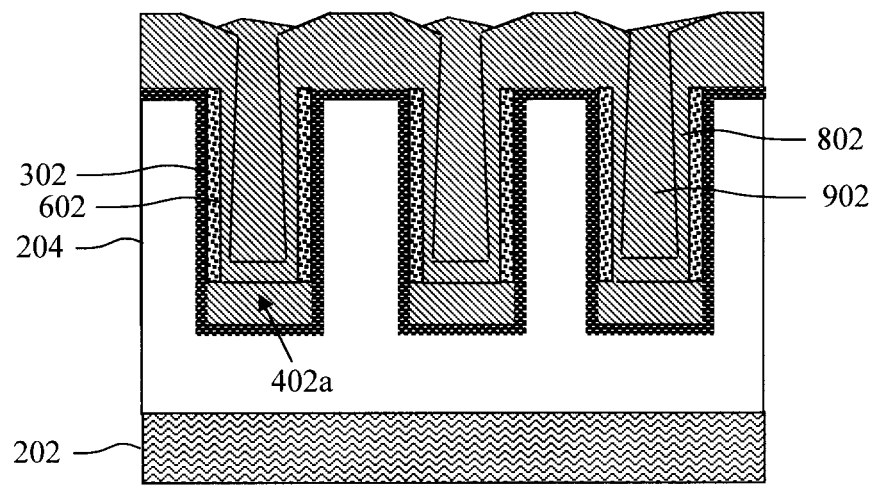
FIG. 9 is a cross-sectional diagram illustrating a second Cu fill having been deposited into the features over the first Cu-containing seed layer according to an embodiment of the present invention.

Cu fill 902 is then deposited into the features 206 over seed layer 802. See FIG. 9. The terms "first" and "second" may also be used herein when referring to Cu fill 402 and Cu fill 902, respectively. As shown in FIG. 9, Cu fill 802 overfills features 206. According to an exemplary embodiment, Cu fill 902 is deposited into features 206 using a process such as electrochemical plating. Following plating, an anneal is preferably performed to increase the grain size of the Cu fill 902 through grain regrowth, and to eliminate voids. According to an exemplary embodiment, this anneal is performed at a temperature of from about 200° C. to about 400° C. and ranges therebetween.

Figure 10:
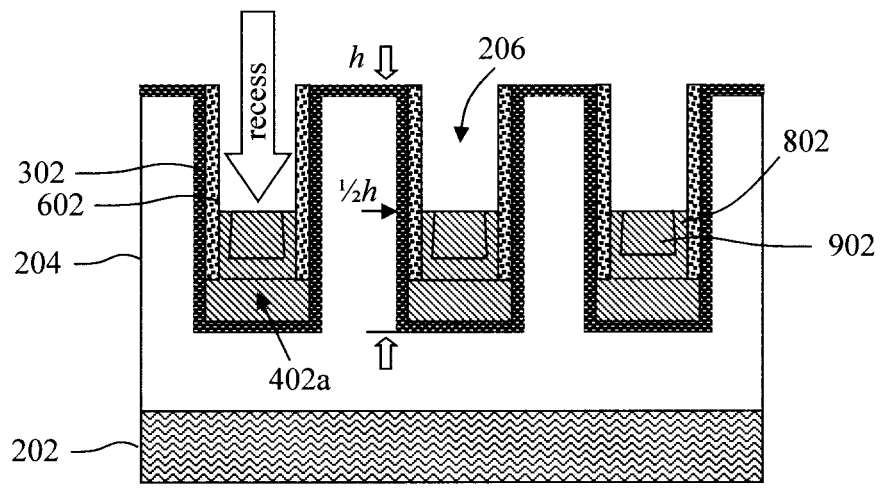
FIG. 10 is a cross-sectional diagram illustrating the first Cu-containing seed layer and the second Cu fill having been recessed according to an embodiment of the present invention.

Seed layer 802 and Cu fill 902 are then recessed. See FIG. 10. By way of example only, seed layer 802/Cu fill 902 can be recessed using an etching process such as CMP with over-polishing or wet chemical etching. According to an exemplary embodiment, the seed layer 802/Cu fill 902 are recessed to approximately the mid-height of features 206. For instance, at this point in the process, if features 206 have a height h (see FIG. 10), then the seed layer 802/Cu fill 902 are recessed to about ½h. As shown in FIG. 10, following the recess etch the seed enhancement liner 602 is still present along the sidewall at the top of features 206. However, a recess etch of the seed enhancement liner 602 will next be performed.

Figure 11:
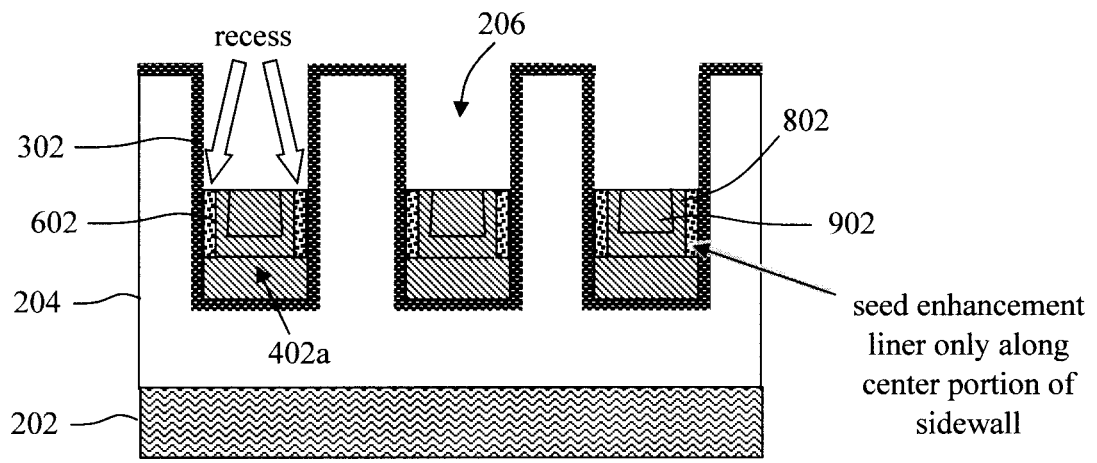
FIG. 11 is a cross-sectional diagram illustrating the seed enhancement liner having been recessed to the height of the (recessed) first Cu-containing seed layer/second Cu fill according to an embodiment of the present invention.
Figure 12:
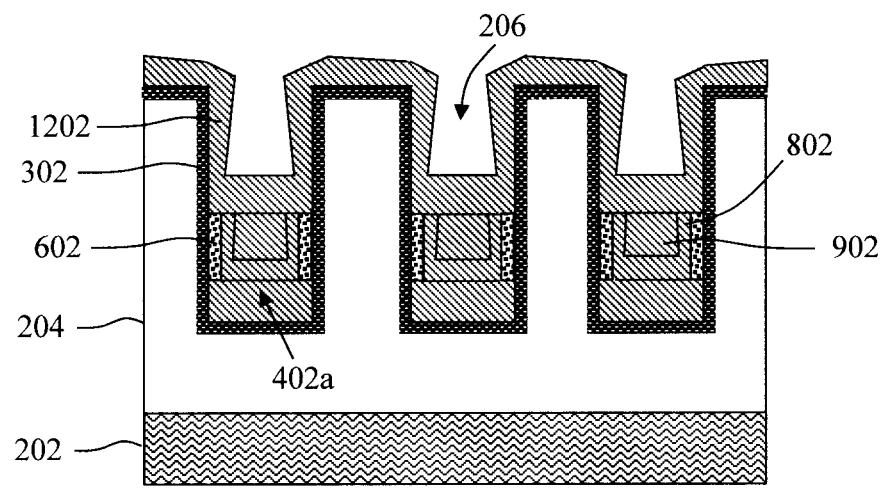
FIG. 12 is a cross-sectional diagram illustrating a second Cu-containing seed layer having been deposited into the features over the (recessed) first Cu-containing seed layer/second Cu fill and the (recessed) seed enhancement liner according to an embodiment of the present invention.

Namely, as shown in FIG. 11, the seed enhancement liner 602 is next recessed to the height of (recessed) seed layer 802/Cu fill 902, e.g., about ½h (see above). According to an exemplary embodiment, the seed enhancement liner 602 is recessed using an etching process such as wet chemical etching. Notably, the seed enhancement liner 602 is now present along only the middle portion of the sidewalls of features 206. In other words, what remains of the seed enhancement liner 602 following the recess etch will touch neither the top nor the bottom of features 206, i.e., the seed enhancement liner 602 is absent from both the top and the bottom of features 206. Removal of the seed enhancement liner 602 from the top of features 206 advantageously avoids galvanic corrosion of the copper during a subsequent CMP step (see below). As provided above, galvanic corrosion can lead to copper loss at the top of the interconnect which is a key contributor to high line resistance.

A copper oxide reduction is then preferably performed to convert any copper oxide on the surface of seed layer 802/Cu fill 902 to metallic copper. According to an exemplary embodiment, this copper oxide reduction is performed using a pure hydrogen ($H_2$) plasma or a reactive plasma clean process containing hydrogen/helium ($H_2$/He) or hydrogen/neon ($H_2$/Ne) gas mixtures. Following the copper oxide reduction, a Cu-containing seed layer 1202 is deposited into features 206 over (recessed) seed layer 802/Cu fill 902 and (recessed) seed enhancement liner 602. See FIG. 12. For clarity, the terms "first" and "second" may also be used herein when referring to seed layer 802 and seed layer 1202.

As with seed layer 802, the use of seed layer 1202 will facilitate plating of Cu 1302 (see below) into the features 206. However, in this case seed layer 1202 is being deposited into much lower aspect ratio features 206 than seed layer 802. Namely, the bottom ½h (see above) of the features 206 are already filled by (recessed) seed layer 802/Cu fill 902. Thus, even though the seed enhancement liner 602 is no longer present along the sidewalls at the tops of features 206, full coverage of seed layer 1202 without voids along the lower aspect ratio features 206 can be easily achieved. Seed layer 1202 can be formed from Cu alone or in combination with one or more other elements such as Al and/or Mn, i.e., a CuAl or CuMn alloy. A process such as CVD, ALD or PVD can be employed to deposit the seed layer 1202.

Figure 13:
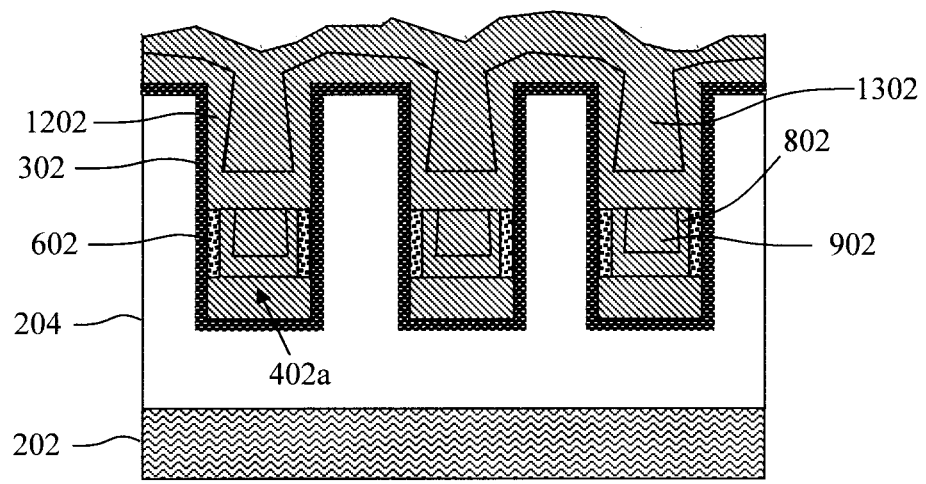
FIG. 13 is a cross-sectional diagram illustrating a third Cu fill having been deposited into the features over the second Cu-containing seed layer according to an embodiment of the present invention.

A Cu fill 1302 is then deposited into the features 206 over seed layer 1202. See FIG. 13. For clarity, the term "third" may also be used herein when referring to Cu fill 1302, so as to distinguish it from first Cu fill 402 and second Cu fill 902. As shown in FIG. 13, Cu fill 1302 overfills features 206. According to an exemplary embodiment, Cu fill 1302 is deposited into features 206 using a process such as electrochemical plating. Following plating, an anneal is preferably performed to increase the grain size of the Cu fill 1302 through grain regrowth, and to eliminate voids. According to an exemplary embodiment, this anneal is performed at a temperature of from about 200° C. to about 400° C. and ranges therebetween.

Seed layer 1202 and Cu fill 1302 are then polished using a process such as CMP. See FIG. 14. Advantageously, the seed enhancement liner 602 is absent from the sidewalls at the tops of features 206. Thus, this polishing occurs only at an interface between seed layer 1202/Cu fill 1302 and barrier layer 302. To look at it another way, there is no seed enhancement liner 602 (e.g., Ru, Rh and/or Pd) present at this interface. Accordingly, the galvanic corrosion of Cu during CMP of materials such as Ru, Rh and/or Pd can be avoided altogether thus preventing Cu loss at a top interface of the interconnect.

Cu fill 402a, seed layer 802, Cu fill 902, seed layer 1202 and Cu fill 1302 collectively form interconnects 1402 in features 206. It is notable that, in FIG. 1 (described above), the interfaces between these various layers were omitted for the purpose of clarity. However, the structures shown in FIG. 1 and FIG. 14 have the same configuration, dimensions, etc. and thus are functionally identical. As such, the same designations of sidewall height H/H', width W1/W1', W2/W2', etc. are used in both FIG. 1 and FIG. 14.

Figure 14:
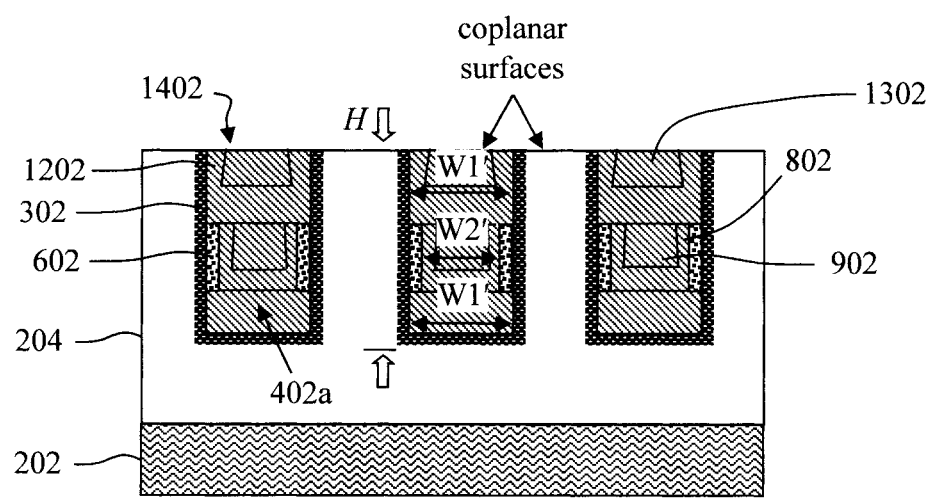
FIG. 14 is a cross-sectional diagram illustrating the second Cu-containing seed layer and the third Cu fill having been polished using a process such as chemical-mechanical polishing (CMP) according to an embodiment of the present invention.

As shown in FIG. 14, the present process results in a unique interconnect structure. Namely, the seed enhancement liner 602 is present only where needed, i.e., along the middle portion of the sidewalls of the features 206. This is what is referred to herein as a 'partial sidewall liner.' According to an exemplary embodiment, the middle portion of the sidewalls of the features 206 along which the seed enhancement liner 602 is present is less than or equal to about 60% of the total sidewall height H' of features 206, for example, the middle portion of the sidewalls of the features 206 along which the seed enhancement liner 602 is present is from about 50% to about 60% and ranges therebetween of the total sidewall height H' of the features 206 (see FIG. 14). Thus, by way of a non-limiting example only, if the height H' of features 206 is 20 nm, then the middle portion of the sidewalls of features 206 along which the seed enhancement liner 602 is disposed is less than or equal to about 12 nm, e.g., from about 10 nm to about 12 nm and ranges therebetween Due to the absence of the seed enhancement liner 602 at the top of the features 206, Cu loss during the CMP is avoided, resulting in a top surface of the interconnects 1402 being coplanar with a top surface of the dielectric 204. See FIG. 14.

Further, since the seed enhancement liner 602 is present along only a middle portion of those sidewalls of the features 206, the interconnects 1402 have a unique flanged top and bottom. For instance, as shown in FIG. 14, the top and the bottom of interconnects 1402 have a width W1', while a middle of the interconnects 1402 has a width W2', wherein W1'>W2'.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An interconnect structure, comprising:
   a substrate;
   a dielectric disposed as a single layer on the substrate having at least one feature present therein, wherein the at least one feature is fully contained within the single layer of the dielectric;
   a barrier layer lining the at least one feature;
   a seed enhancement liner disposed over the barrier layer along sidewalls of the at least one feature, wherein the seed enhancement liner is present along only a middle portion of the sidewalls of the at least one feature; and
   at least one interconnect disposed within the at least one feature over the barrier layer and the seed enhancement liner.

2. The interconnect structure of claim 1, wherein the at least one feature is selected from the group consisting of: a trench, a via, and combinations thereof.

3. The interconnect structure of claim 1, wherein the barrier layer comprises a material selected from the group consisting of: tantalum (Ta), tantalum nitride (TaN), titanium (Ti), titanium nitride (TiN), tungsten nitride (WN), and combinations thereof.

4. The interconnect structure of claim 1, wherein the seed enhancement liner comprises a material selected from the group consisting of: ruthenium (Ru), rhodium (Rh), palladium (Pd), and combinations thereof.

5. The interconnect structure of claim 1, wherein the at least one interconnect comprises copper (Cu).

6. The interconnect structure of claim 1, wherein a top surface of the at least one interconnect is coplanar with a top surface of the dielectric.

7. The interconnect structure of claim 1, wherein the at least one interconnect has a flanged top and bottom with the top and the bottom of the at least one interconnect having a width W1 and a middle of the at least one interconnect having a width W2, and wherein W1>W2.

8. The interconnect structure of claim 1, wherein the middle portion of the sidewalls of the at least one feature along which the seed enhancement liner is present comprises less than or equal to about 60% of a total sidewall height H of the at least one feature.

9. The interconnect structure of claim 1, wherein the middle portion of the sidewalls of the at least one feature along which the seed enhancement liner is present comprises from about 50% to about 60% and ranges therebetween of a total sidewall height H of the at least one feature.

10. The interconnect structure of claim 1, wherein the at least one interconnect comprises a metal line, a conductive via or combinations thereof.

11. A method of forming an interconnect structure, the method comprising the steps of:
    depositing a dielectric as a single layer onto a substrate;
    patterning at least one feature in the dielectric, wherein the at least one feature is fully contained within the single layer of the dielectric;
    depositing a barrier layer into and lining the at least one feature;
    forming a seed enhancement liner over the barrier layer along only a middle portion of sidewalls of the at least one feature; and
    forming at least one interconnect within the at least one feature over the barrier layer and the seed enhancement liner.

12. The method of claim 11, further comprising the steps of:
    depositing a first copper (Cu) fill into the at least one feature over the barrier layer;
    recessing the first Cu fill to form a recessed Cu fill;
    depositing a seed enhancement liner into the at least one feature over the barrier layer and the recessed Cu fill;
    depositing a first Cu-containing seed layer into the at least one feature over the seed enhancement liner, the barrier layer and the recessed Cu fill;
    depositing a second Cu fill into the at least one feature over the first Cu-containing seed layer;
    recessing the first Cu-containing seed layer and the second Cu fill; and
    recessing the seed enhancement liner such that the seed enhancement liner is absent from a top of the at least one feature.

13. The method of claim 12, further comprising the steps of:
    depositing a second Cu-containing seed layer into the at least one feature over the first Cu-containing seed layer, the second Cu fill, and the seed enhancement liner that have been recessed;
    depositing a third Cu fill into the at least one feature over the second Cu-containing seed layer;
    polishing the third Cu fill and the second Cu-containing seed layer, wherein the recessed Cu fill, the first Cu-containing seed layer, the second Cu fill, the second Cu-containing seed layer and the third Cu fill collectively form the at least one interconnect disposed within the at least one feature.

14. The method of claim 12, wherein, following the polishing step, a top surface of the at least one interconnect is coplanar with a top surface of the dielectric.

15. The method of claim 11, wherein the at least one interconnect has a flanged top and bottom with the top and the bottom of the at least one interconnect having a width W1 and a middle of the at least one interconnect having a width W2, and wherein W1>W2.

16. The method of claim 11, wherein the middle portion of the sidewalls of the at least one feature along which the seed enhancement liner is present comprises from about 50% to about 60% and ranges therebetween of a total sidewall height H of the at least one feature.

17. The method of claim 11, wherein the at least one features is selected from the group consisting of: a trench, a via, and combinations thereof.

18. The method of claim 11, wherein the barrier layer comprises a material selected from the group consisting of: Ta, TaN, Ti, TiN, WN, and combinations thereof.

19. The method of claim 11, wherein the seed enhancement liner comprises a material selected from the group consisting of: Ru, Rh, Pd, and combinations thereof.

* * * * *